United States Patent [19]

Patil

[11] Patent Number: 5,028,817
[45] Date of Patent: Jul. 2, 1991

[54] TRISTABLE OUTPUT BUFFER WITH STATE TRANSITION CONTROL

[75] Inventor: Tarang P. Patil, Fremont, Calif.

[73] Assignee: Zoran Corporation, Santa Clara, Calif.

[21] Appl. No.: 537,578

[22] Filed: Jun. 14, 1990

[51] Int. Cl.⁵ .......................................... H03K 17/04
[52] U.S. Cl. .................................. 307/443; 307/475
[58] Field of Search ................ 307/443, 475, 263, 451

[56] References Cited

U.S. PATENT DOCUMENTS

| | | | |
|---|---|---|---|
| 4,771,195 | 9/1988 | Stein | 307/443 |
| 4,777,389 | 10/1988 | Wu et al. | 307/263 |
| 4,782,252 | 11/1988 | Levy et al. | 307/443 |
| 4,800,298 | 1/1989 | Yu et al. | 307/443 |
| 4,855,622 | 8/1989 | Johnson | 307/443 |
| 4,959,561 | 9/1990 | McDermott et al. | 307/263 |
| 4,961,010 | 10/1990 | Davis | 307/443 |

*Primary Examiner*—David Hudspeth
*Assistant Examiner*—Andrew Sanders
*Attorney, Agent, or Firm*—Henry K. Woodward

[57] ABSTRACT

Voltage on a circuit ground terminal in an output buffer is controlled by limiting induced voltage on a circuit ground pad as the output makes a transition from a high voltage level to a low voltage level thereby minimizing deleterious effects on other circuits connected to the common circuit ground terminal. A ground bounce circuit controls the bias on a transistor connecting the output to the circuit ground terminal with power saver circuitry limiting actuation of the ground bounce circuitry except during the high to low transitional phase.

6 Claims, 2 Drawing Sheets

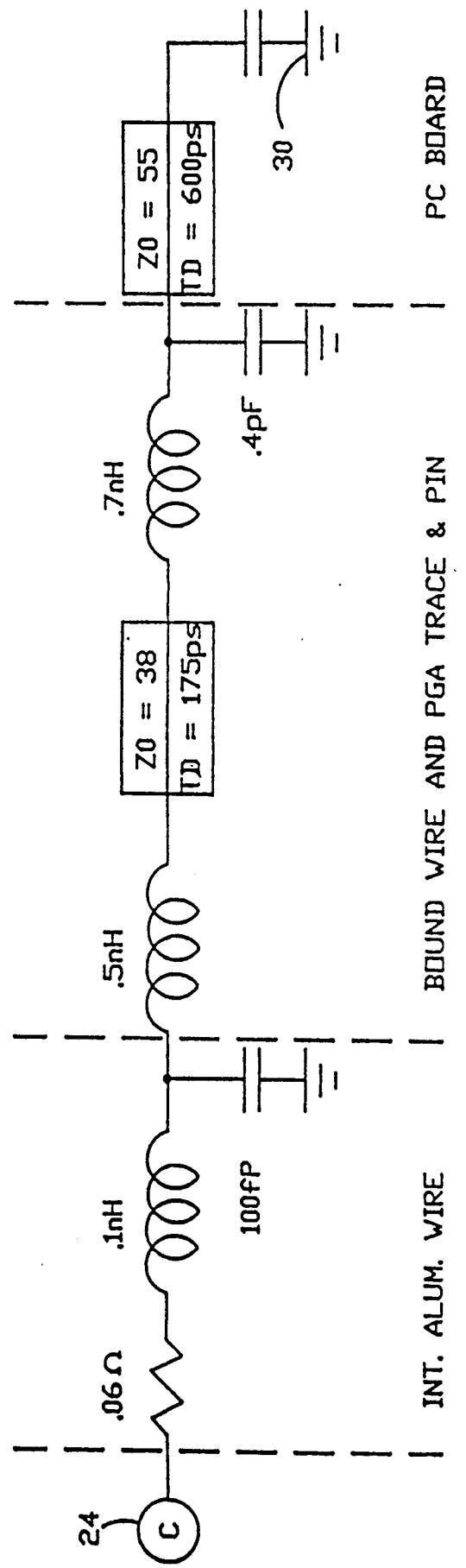
FIG.—2

5,028,817

TRISTABLE OUTPUT BUFFER WITH STATE TRANSITION CONTROL

BACKGROUND OF THE INVENTION

This invention relates generally to output buffer circuits, and more particularly the invention is directed to a buffer circuit in which state transition is controlled to prevent false readings in adjacent circuitry.

The tristate buffer is drive circuitry which responds to two inputs by providing three outputs; high, low and floating. In a typical circuit a first input controls the output in either floating or responding to the second input which can be a high (+v) or a low (ground) voltage level.

When the output goes from a high (+v) to a low (ground) voltage state, a transistor responds to the second input transition and ties the output to a circuit ground terminal. However, the circuit ground terminal is tied to ground through inductive interconnections of the circuit, circuit carrier, and printed circuit board on which the carrier is mounted. Thus a voltage rise can occur at the circuit ground terminal during a high to low voltage transition which can adversely affect other buffers and circuits tied to the common circuit ground terminal.

The present invention is directed to a buffer circuit in which deleterious effects of voltage transitions are minimized.

SUMMARY OF THE INVENTION

Accordingly, an object of the invention is an improved buffer circuit in which deleterious effects of voltage transitions are minimized.

Another object of the invention is a tristate buffer in which an output transition from a high voltage state to a low voltage state provided by a ground pad does not adversely affect other circuits connected to the ground pad.

Yet another object of the invention is control circuitry which controls buffer circuit operation only during selective transitions.

Briefly, a buffer circuit in accordance with the invention includes a first input for receiving high and low input voltages, an output for providing high and low output voltages in response to the input voltage, and first logic circuitry interconnecting the input to the output, the logic circuitry including transistor means for connecting the output to a circuit ground terminal in response to a transition of input voltages. Control circuitry is provided which is responsive to the transition of input voltages for limiting the conduction of the transistor means during the transition whereby induced voltage on the circuit ground terminal is controlled during the transition.

More particulary, the control means includes control logic circuitry which responds to the output being in a high voltage state and the input being in a state for changing the output to a low voltage state. The control means includes a level shifter and amplifier responsive to the control logic circuitry for applying a bias voltage to the transistor means whereby the output is gradually connected to the circuit ground terminal thereby controlling induced voltage on the circuit ground terminal.

In a preferred embodiment the buffer circuit is tristate and further includes a second input for controlling the third state where the output floats.

The invention and objects and features thereof will be more readily apparent on the following detailed description and dependent claims when taken with the drawing.

BRIEF DESCRIPTION OF THE DRAWING

FIG. 2 is a schematic diagram illustrating inductances interconnecting a circuit ground terminal of the circuit of FIG. 1 to ground.

DETAILED DESCRIPTION OF ILLUSTRATIVE EMBODIMENTS

Figure 1:
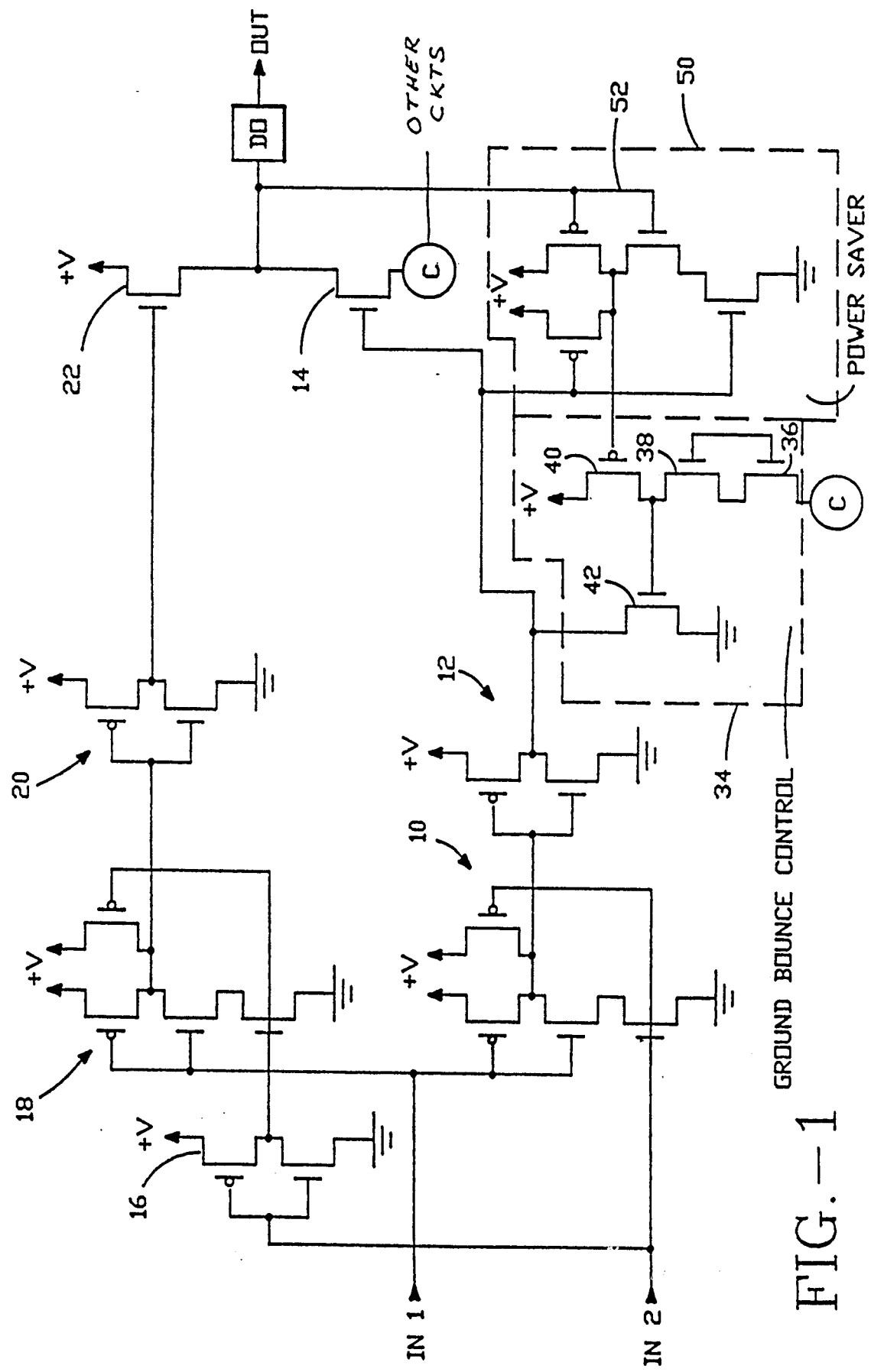
FIG. 1 is a schematic diagram of a tristable output buffer in accordance with one embodiment of the invention.

Referring now to the drawing, FIG. 1 is a schematic of a tristate output buffer in accordance with one embodiment of the invention. The buffer includes two inputs, IN1 and IN2, and an output, OUT. The two inputs are connected to a CMOS Nand Gate 10 with the output of the Nand Gate connected through invertor 12 to the gate of N-channel transistor 14.

The input, IN2 is connected through an inverter 16 to a second CMOS Nand Gate 18 along with the input IN1. The output of Nand Gate 18 is connected to inverter 20 with the output of invertor 20 applied to the gate of N-channel transistor 22. Transistors 14 and 22 are serially connected between a circuit ground terminal 24(C) and a voltage potential, +V. The output terminal is connected to the common terminal of transistors 14 and 22.

In operation, the input IN1, controls whether the output is in a floating state (the third state) or in one of two states determined by the voltage on input terminal IN2. When IN1 is low the output is not connected to either ground or +V and is allowed to float. When IN1 is high (+V) the output is the inverse of the voltage on IN2.

A problem arises when the output is in a transition from a high state (+V) to a low state (Ground). This arises because the circuit ground terminal 24 is not connected directly to ground but rather through an inductive connection to ground. This is illustrated in the schematic of FIG. 2 wherein terminal C is connected through aluminum wire on the integrated circuit through bond wire of the circuit package and through the printed circuit board to ground at 30. Thus a transition of the output from a high voltage to ground induces a voltage on the circuit ground terminal 24 which can rise above one volt and thereby affect other buffers and circuits which are connected to the same circuit ground terminal.

The present invention is directed to circuitry for limiting the induced voltage on the circuit ground terminal during a transition of the output state whereby the voltage on the circuit ground terminal does not reach a level which is sufficient to have deleterious effects on other circuits connected thereto. This is accomplished by a ground bounce control circuit shown generally at 34 which includes level sensor transistors 36, 38 and 40 which are serially connected between the circuit ground terminal C and +V. The level shifter transistors amplify the voltage swing at the terminal 24 which is then applied to activate transistor 42. When transistor 42 is activated, the bias voltage applied to transistor 14 is reduced thereby limiting the current therethrough and the voltage which can develop on the circuit ground terminal C. Conduction of transistor 42 is proportional to the voltage induced at terminal C; when the induced voltage is near zero, transistor 42 does not conduct.

A power saver circuit 50 limits the actuation of the ground bounce circuit 34 to the state where the output is high and IN2 goes high thereby causing a transition of the output to a low state. Circuit 50 includes a Nand Gate having an input 52 connected to the output of the circuit and an input 54 connected to the gate of transistor 14. When both inputs are high (ie indicating a transition of the output from a high level to a low level) transistor 40 of the ground base circuit 34 is activated thereby allowing transistor 42 to be activated. In all other conditions of the buffer circuit, transistor 40 and hence transistor 42, are not activated. Accordingly power is saved by allowing the Ground Bounce Circuit 34 to operate only in the transition state of the output from a high level to a low level.

By properly scaling the sizes of transistors of invertor 12, bounce circuit 34, and power saver 50, the maximum voltage at the circuit ground terminal during the transition can be limited to a safe voltage level of, for example, 1.0 volt. Accordingly, operation of the output buffer will not have deleterious effects on other buffer circuitry connected to the circuit ground terminal C.

While the invention has been described with reference to a specific embodiment, the description is illustrative of the invention and is not to be construed as limiting the invention. Various modifications and applications may occur to those skilled in the art without departing from the true spirit and scope of the invention as defined by appended claims.

I claim:
1. A buffer circuit comprising
a first input for receiving high and low input voltages,
an output for providing high and low output voltages in response to said input voltages,
first logic circuitry interconnecting said input to said output, said logic circuitry including transistor means for connecting said output to a circuit ground terminal in response to a transition of input voltages, and
control means responsive to said transition of input voltages for limiting the conduction of said transistor means during said transition whereby induced voltage on said circuit ground terminal is controlled during said transition, said control means including,
control logic circuitry which responds to said output being in a high voltage state and said input being in a state for changing said output to a low voltage state, and
a level shifter and amplifier responsive to said control logic circuitry for applying bias voltage to said transistor means whereby said output is gradually connected to said circuit ground terminal and thereby controlling induced voltage on said circuit ground terminal.

2. The buffer circuit as defined by claim 1 wherein said buffer circuit is tristate and further including a second input for controlling a third state wherein said output floats.

3. The buffer circuit as defined by claim 2 wherein said first logic circuitry includes a first Nand gate responsive to said first and second inputs and a first invertor responsive to said first Nand gate for applying a bias voltage to said transistor means.

4. The buffer circuit as defined by claim 3 and further including pull-up means serially connected with said transistor means, and second logic circuitry including a second Nand gate responsive to said first and second inputs and a second invertor responsive to said second Nand gate for applying a bias voltage to said pull-up means.

5. The buffer circuit as defined by claim 4 wherein said control means further includes power saver circuitry responsive to transitions of said output whereby said level shifter and amplifier are activated only when the transition state of said output is from a high level to a low level.

6. The buffer circuit as defined by claim 1 wherein said control means further includes power saver circuitry responsive to transitions of said output whereby said level shifter and amplifier are activated only when the transition state of said output is from a high level to a low level.

* * * * *